US006980246B1

(12) United States Patent
Ducourant et al.

(10) Patent No.: US 6,980,246 B1
(45) Date of Patent: Dec. 27, 2005

(54) PROCESS FOR CONTROLLING A PHOTOSENSITIVE DEVICE INCLUDING A PHOTOSENSITIVE POINT PRODUCED BY TECHNIQUES FOR DEPOSITING SEMICONDUCTOR MATERIALS

(75) Inventors: Thierry Ducourant, Voiron (FR);
Christophe Chaussat, St Nizier (FR);
Robert Neyret, Coublevie (FR);
Christophe Barnichon, Grenoble (FR);
Clément Atoyan, Grenoble (FR); Paul Apard, Renage (FR)

(73) Assignee: Trixell S.A.S., Moirans (FR)

( * ) Notice: Subject to any disclaimer, the term of this patent is extended or adjusted under 35 U.S.C. 154(b) by 713 days.

(21) Appl. No.: 09/926,834

(22) PCT Filed: Jun. 27, 2000

(86) PCT No.: PCT/FR00/01795

§ 371 (c)(1),
(2), (4) Date: Dec. 28, 2001

(87) PCT Pub. No.: WO01/03419

PCT Pub. Date: Jan. 11, 2001

(30) Foreign Application Priority Data

Jul. 6, 1999 (FR) .................................. 99 08707

(51) Int. Cl.⁷ .......................... G01T 1/24; H01L 27/00; H04N 5/228; H04N 5/335; H05G 1/64
(52) U.S. Cl. ...................... 348/328; 348/241; 348/310; 378/98.8; 250/370.09; 250/208.1
(58) Field of Search ............................... 348/241, 243, 348/251, 296, 302, 307, 308, 309, 310, 312, 348/294, 328; 378/98.8, 98.12; 250/370.09, 250/363.09, 208.1

(56) References Cited

U.S. PATENT DOCUMENTS

| 4,638,355 | A | * | 1/1987 | Melman ................... 378/98.12 |
| 4,827,145 | A | * | 5/1989 | Arques ....................... 378/98.8 |
| 4,948,966 | A | * | 8/1990 | Arques et al. ............... 348/294 |
| 5,352,884 | A | * | 10/1994 | Petrick et al. ......... 250/370.09 |
| 5,608,205 | A | * | 3/1997 | Bird et al. ................ 250/208.1 |
| 5,777,495 | A | * | 7/1998 | Arques et al. ................. 327/94 |
| 5,973,327 | A | * | 10/1999 | Moy et al. ............. 250/370.09 |
| 6,115,451 | A | * | 9/2000 | Boudry et al. ............. 378/98.8 |
| 6,265,737 | B1 | * | 7/2001 | Ducourant ................... 257/290 |
| 6,393,097 | B1 | * | 5/2002 | Aufrichtig et al. ......... 378/98.8 |
| 6,410,898 | B2 | * | 6/2002 | Ducourant et al. .... 250/370.09 |
| 6,528,775 | B2 | * | 3/2003 | Ducourant ............... 250/208.1 |

(Continued)

FOREIGN PATENT DOCUMENTS

EP         0 364 314        4/1990

(Continued)

*Primary Examiner*—Thai Tran
*Assistant Examiner*—John M. Villecco
(74) *Attorney, Agent, or Firm*—Oblon, Spivak, McClelland, Maier & Neustadt, P.C.

(57) ABSTRACT

A process for controlling a photosensitive device including at least one photosensitive point with a photodiode connected to a switching element. The process submits the photosensitive point to successive imaging cycles. Between a first imaging cycle and a second imaging cycle, the process produces a holding phase terminating at the start of the second imaging cycle. During this holding phase, whose duration is equal to several equal time intervals that are as short as possible, the photosensitive point is exposed to an optical flash at the start of each time interval. Between successive optical flashes, the photodiode is reverse biased. The junction region between the photodiode and the switching element has substantially the same potential at the end of each time interval.

22 Claims, 6 Drawing Sheets

U.S. PATENT DOCUMENTS

| | | | |
|---|---|---|---|
| 6,618,604 B2 * | 9/2003 | Petrick et al. | 250/208.1 |
| 6,686,959 B1 * | 2/2004 | Ducourant et al. | 348/241 |
| 6,737,654 B2 * | 5/2004 | Ducourant | 250/370.11 |
| 6,798,864 B2 * | 9/2004 | Petrick et al. | 378/98.8 |
| 6,801,598 B2 * | 10/2004 | Tashiro et al. | 378/98.8 |
| 6,828,563 B2 * | 12/2004 | Ducourant | 250/370.11 |
| 2004/0056204 A1 * | 3/2004 | Tanaka et al. | 250/370.09 |
| 2004/0200954 A1 * | 10/2004 | Cazaux et al. | 250/214 R |

FOREIGN PATENT DOCUMENTS

FR     2 760 585     9/1998

* cited by examiner

PROCESS FOR CONTROLLING A PHOTOSENSITIVE DEVICE INCLUDING A PHOTOSENSITIVE POINT PRODUCED BY TECHNIQUES FOR DEPOSITING SEMICONDUCTOR MATERIALS

BACKGROUND OF THE INVENTION

1. Field of the Invention:

The present invention relates to a process for controlling a photosensitive device consisting of at least one photosensitive point produced by techniques for depositing semiconductor materials such as amorphous silicon. The aim of the invention is to enable images to be taken at random times, the imaging produced by the photosensitive device having as good a quality as possible especially in terms of remanence and stability.

More particularly but not exclusively, the invention relates to the control of such devices used in the detection of radiological images.

2. Discussion of the Background

In order to use these photosensitive devices in the detection of radiological images, a scintillator is inserted between the photosensitive device and the X-ray radiation in order to convert the X-ray radiation into optical radiation in the wavelength band to which the photosensitive point is sensitive. The scintillator material is generally cesium iodide, which is known for its low intrinsic remanence.

A photosensitive point generally comprises a photodiode combined with a switching element having a switching function. The photodiode at least is made from an amorphous semiconducting material. The photosensitive point is mounted between a row conductor and a column conductor. According to requirements, the photosensitive device then comprises a plurality of photosensitive points arranged in a matrix or in a linear array.

The amorphous semiconducting material produces the remanence. This is linked to its amorphous structure which comprises a large number of traps, many more than in crystalline materials. These traps are structural defects which extend throughout the bandgap. They retain charges generated on taking an image. The material stores an image corresponding to a given radiation and restores charges relating to this image on reading the following image or even several following images. The quality of the images thereby suffers.

Another defect affects the quality of the images. The semiconductor components used in such photosensitive devices are not all identical and the photosensitive device has inherent inhomogeneities which result in impaired regions and which vary over time.

To try to obtain a useful image of optimal quality, the useful image is corrected from an image called an "offset image", also known as a black image, generally taken and stored at the start of an operating cycle. This offset image is the image obtained when the photosensitive device is exposed to a signal of zero intensity and corresponds to a sort of background image. The offset image varies depending on the electrical state of the components of the photosensitive points and of the dispersion of their electrical characteristics.

The useful image is that read when the photosensitive device has been exposed to a useful signal which corresponds to an exposure to X-ray radiation. It encompasses the offset image.

The correction consists in carrying out a subtraction between the useful image and the offset image. This correction is only reliable if the offset image has not varied between the moment where it was taken and the moment where the useful image is taken. It is necessary for the photosensitive points to be in the same electrical state just before taking the offset image and before taking the useful image. In the absence of control, the semiconductor components are continuously searching for an equilibrium state which may be reached in a few hours since the time taken to fill the traps and that taken to empty them of stored charges spreads out over time ranges of between a few microseconds and a few minutes or even a few hours. After this period of time their state may still vary depending on the temperature or on infinitesimal variations of residual irradiation.

Since the offset image is generally taken at the start of the operating cycle of the photosensitive device and since the useful image, actuated at the discretion of the radiologist, is taken randomly as needed, there is no reason for all the semiconductor components to be in the same state at these two times which are separated by a variable time interval.

Figure 1A:
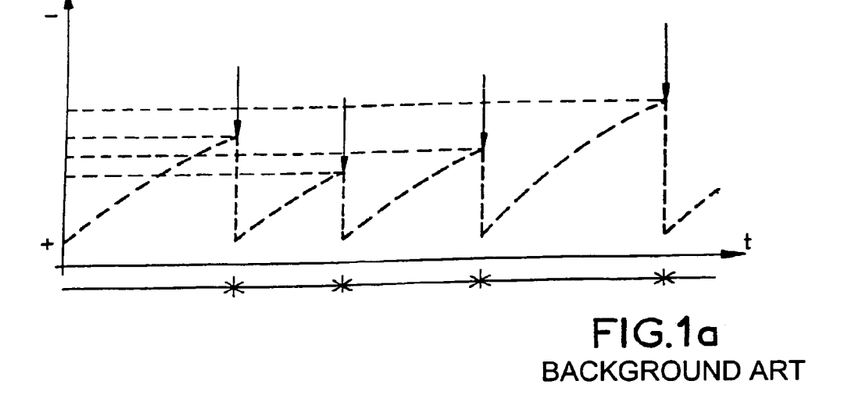
FIGS. 1a, 1b, already described, show the state of the traps of the components of a photosensitive point when it is used according to known procedures.
Figure 1B:
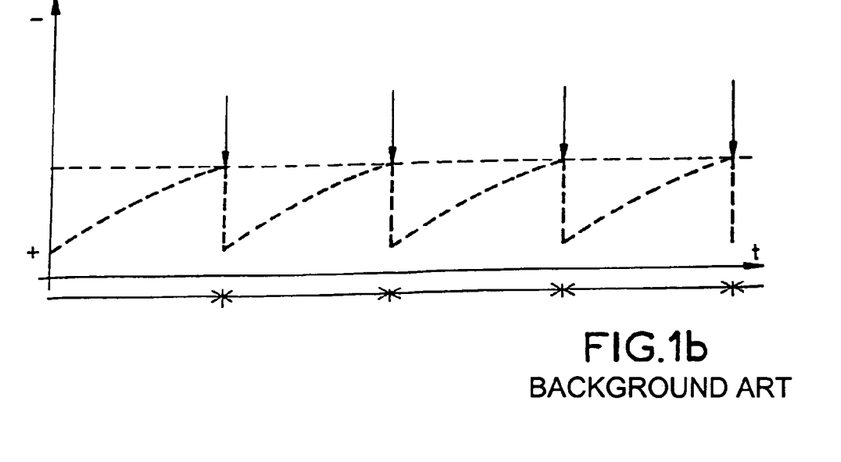

FIGS. 1a, 1b symbolize of the the fill state of the traps of the components of a photosensitive point of a photosensitive device to which the invention may be applied, over time. The arrows represent imaging cycles. The term "imaging cycle" refers to the sequence consisting of an imaging phase followed by a read phase then by an erasure and reinitialization phase, as explained in Patent Application FR-A-2 760 585. During the imaging phase, the photosensitive points are exposed to a signal to be picked up, whether this signal is at maximum illumination or darkness, during the read phase a read pulse is applied to the addressed row conductors in order to read the amount of charge accumulated on taking the image. During the erasure and reinitialization phase, the photosensitive points are erased, generally optically, and returned to a state in which they are receptive to new imaging.

Between two successive imaging cycles, the photosensitive points are left at rest, but their electrical state changes. It is assumed that the first imaging cycle represented provides the offset image and the others, useful images to be corrected with the offset image.

It can be clearly seen that if the imaging cycles occur randomly, as in FIG. 1a, the electrical states of the photosensitive point being different at the start of the cycle, the useful images corrected with the offset image cannot be reliable.

On the other hand, in FIG. 1b, the imaging cycles occur regularly, for example every five seconds, and at the start of each cycle the electrical state of the photosensitive point is substantially the same.

The offset image has not fluctuated and the correction of a useful image taken during a cycle with the offset image taken during another preceding cycle, is reliable. The major drawback of this operating mode is that it brings many constraints, since the various cycles must follow one another periodically in order to obtain the expected result.

This use is very restrictive and is not compatible with the expectations of radiologists who wish to be able to request images as needed. The present invention proposes to avoid this major drawback while guaranteeing an image of optimum quality.

SUMMARY OF THE INVENTION

According to the invention, a process for controlling a photosensitive device comprising at least one photosensitive point with a photodiode connected to a switching element, consists in submitting the photosensitive point to successive imaging cycles and between a first imaging cycle and a second imaging cycle, in producing a holding phase terminating at the start of the second imaging cycle. During this holding phase, whose duration is equal to several equal time intervals which are as short as possible, the photosensitive point is exposed to an optical flash at the start of each time interval and between the successive optical flashes, the photodiode is reverse biased, the junction region between the photodiode and the switching element having substantially the same potential at the end of each time interval.

An imaging cycle comprises an imaging phase followed by a phase of reading the amount of charge accumulated in the junction region during the imaging phase, the read phase being followed by an erasure and reinitialization phase, during which the photosensitive point is exposed to an optical erasure stream causing the photodiode to conduct in the forward direction, and the photodiode to be reverse biased at the end of the erasure and reinitialization phase.

During the operation of such devices, it is an operator who requests an image and some delay may appear between the request and the start of the corresponding imaging cycle, since the start of the imaging cycle is designed to be synchronized with the end of the time interval during which the operator's request occurs.

In order to overcome possible problems of electrical disturbances it is preferable for the frequency of the optical flashes to be that of the mains used, for example 50 Hz or 60 Hz.

It is preferable to leave the photosensitive point in the biased state for the entire duration of the holding phase, for the purpose of simplifying the control circuits.

With the same aim, during the erasure and reinitialization phase, it is preferable to apply to the photosensitive point a biasing pulse starting before the end of the exposure to the optical erasure flux and continuing thereafter.

During the erasure and reinitialization phase, before the exposure of the photosensitive point to the optical erasure flux, it is possible to expose it at least once to an optical pre-erasure flux causing the photodiode to conduct in the forward direction so as to improve the erasure, when very low remanence levels are required.

The exposure of the photosensitive point to the optical pre-erasure flux is followed by the reverse biasing of the photodiode, this reverse biasing of the photodiode occurring before exposure to the optical erasure flux.

The holding phase starts as quickly as possible after the end of the first imaging cycle so as to keep the photosensitive point substantially in the same state at the start of the holding phase as at the end of the first imaging cycle.

During the read phase, a read pulse having the same sign as and an amplitude greater than or equal to the biasing pulse is applied to the photosensitive point.

The present invention also relates to a photosensitive device implementing the control process. It comprises at least one photosensitive point with a photodiode connected to a switching element, means for exposing the photosensitive point to a series of periodic optical flashes and means to reverse bias the photodiode at the end of an optical flash so that it is in a receptive state from the start of the second imaging cycle.

BRIEF DESCRIPTION OF THE DRAWINGS

Other characteristics and advantages of the invention will appear on reading the following detailed description, made by way of nonlimiting examples with reference to the appended drawings in which.

DESCRIPTION OF THE PREFERRED EMBODIMENTS

Figure 2:
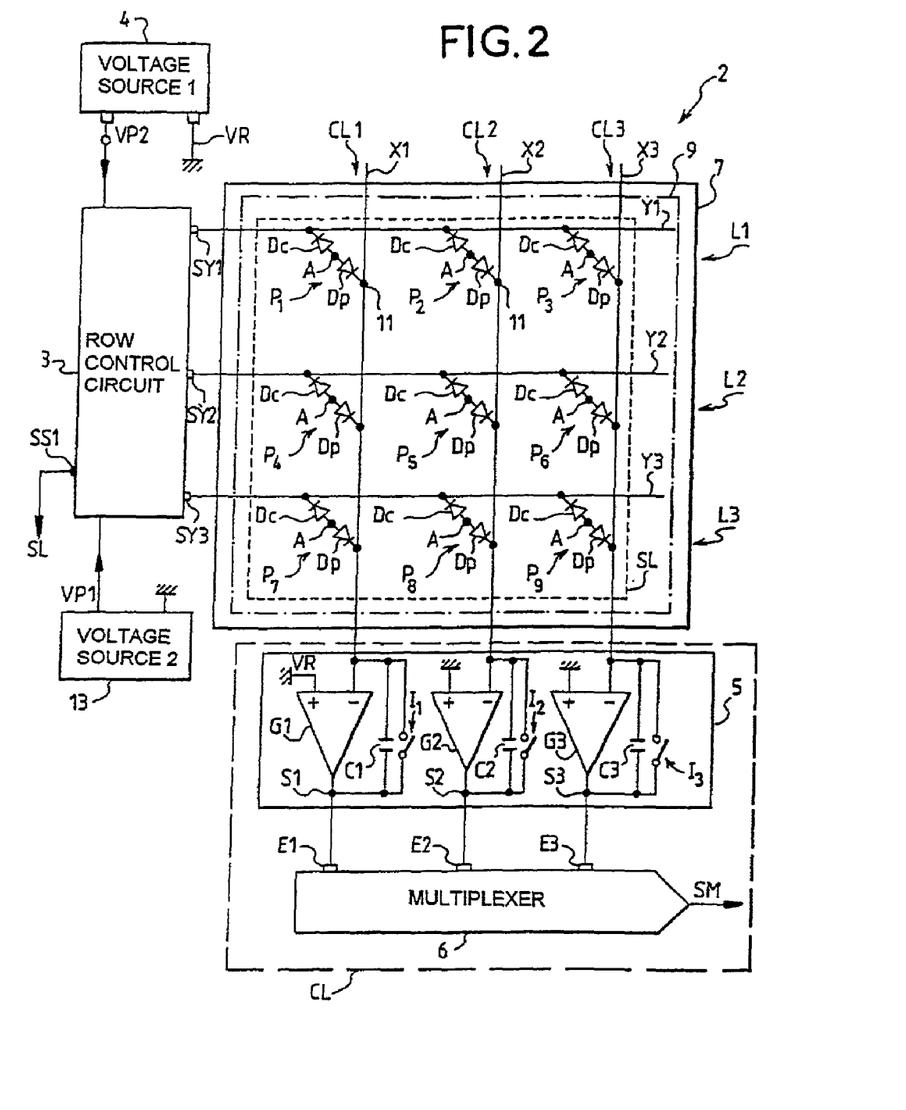
FIG. 2 shows a photosensitive device to which the process of the invention may be applied.

FIG. 2 shows schematically an example of a photosensitive device 2 to which the process of the invention may be applied. It comprises photosensitive points arranged in a matrix and referenced P1 to P9. Each photosensitive point consists of a photodiode Dp and a switching diode Dc assembled in series in a back-to-back configuration. The matrix comprises row conductors Y1 to Y3 intersecting with column conductors X1 to X3, with a photosensitive point connected between a row conductor and a column conductor at each intersection. The photosensitive points P1 to P9 are thus placed along rows L1 to L3 and columns CL1 to CL3.

In the example of FIG. 2, only three rows and three columns are shown and they define nine photosensitive points, but such a matrix may have a much larger capacity, possibly going up to several million points. For example, it is common to produce such matrices having photosensitive points placed along 2000 rows and 2000 columns (over an area of about 40 cm×40 cm) or even arranged over a single row and several columns in order to form a linear detection array, or even arranged over a single row and a single column in order to form a single photosensitive point.

The photosensitive device comprises a row control circuit 3, the outputs SY1, SY2, SY3 of which are connected to the row conductors Y1, Y2, Y3, respectively. The row control circuit 3 has various elements (not shown), such as for example, a clock circuit, switching circuits, shift register, which enable it in particular to address row conductors Y1 to Y3 sequentially. At each photosensitive point P1 to P9, the two diodes Dp, Dc are connected to each other either by their cathode, or by their anode, as in the example shown. The cathode of the photodiode Dp is connected to a column conductor X1 to X3, and the cathode of the switching diode Dc is connected to a row conductor Y1 to Y3.

The column conductors X1 to X3 are connected to a read circuit CL, in the example comprising an integrator circuit 5 and a multiplexer circuit 6. Each column conductor is connected to a negative input"−"of an amplifier G1 to G3 mounted as an integrator. An integrating capacitor C1 to C3 is mounted between the negative input "−" and an output S1 to S3 of each amplifier. The second input "+" of each amplifier G1 to G3 is connected to a potential which, in the example, is the reference potential VR, a potential which is subsequently applied to all the column conductors X1 to X3. Each amplifier comprises a switching element 11 to 13, called a "reset element" (for example consisting of a transistor of the MOS type), mounted in parallel with each integrating capacitor C1 to C3.

The outputs S1 to S3 of the amplifiers are connected to the inputs E1 to E3 of the multiplexer 6. This conventional arrangement makes it possible to deliver "in series" and row after row (L1 to L3), at the output SM of the multiplexer 6, signals which correspond to the charges accumulated at the points "A" of all the photosensitive points P1 to P9.

It should be noted that it is also known for a transistor to be used to fulfil the switching function which, in the example of FIG. 2, is held by the switching diode Dc; compared to the diode, the latter is more complex to connect, but it offers advantages in the quality of its "on" state, advantages which will be mentioned in the rest of the description.

Figure 3A:
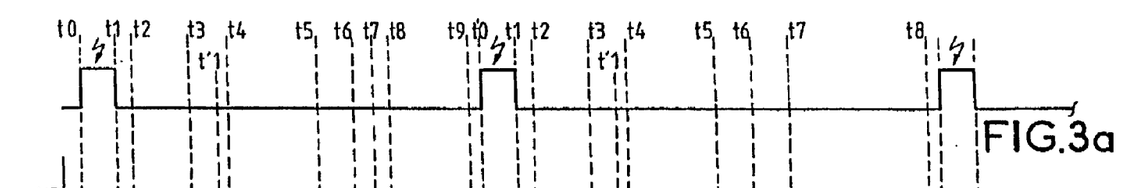
FIGS. 3a to 3e show timing diagrams illustrating the operation of the photosensitive device of FIG. 2 under the control of the process of the invention.
Figure 3B:
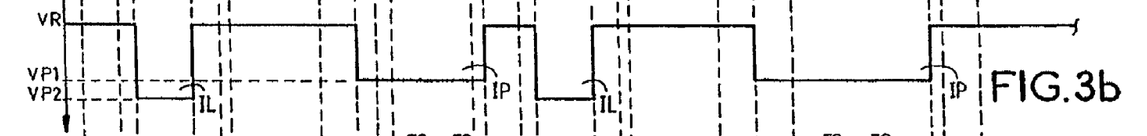
Figure 3C:
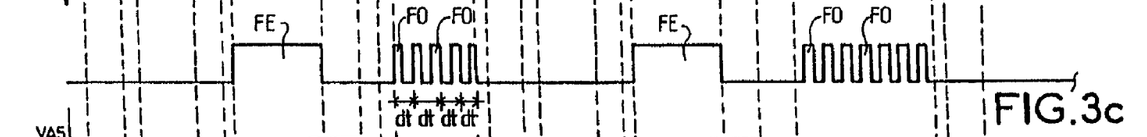
Figures 3D, 3E:
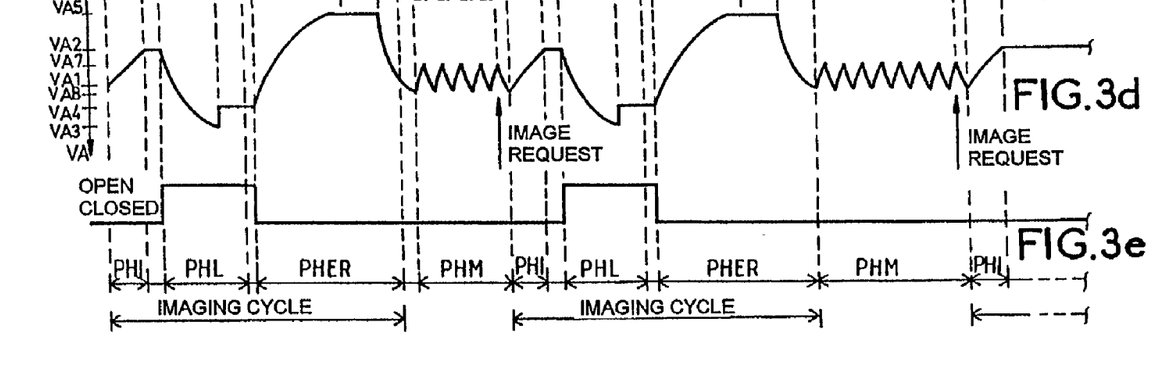
Figure 4A:
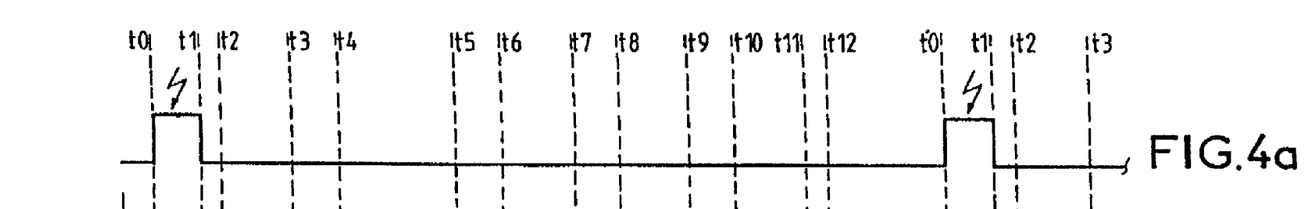
FIGS. 4a to 4d show timing diagrams illustrating the operation of the device of FIG. 2 under the control of a variant of the process of the invention.
Figure 4B:
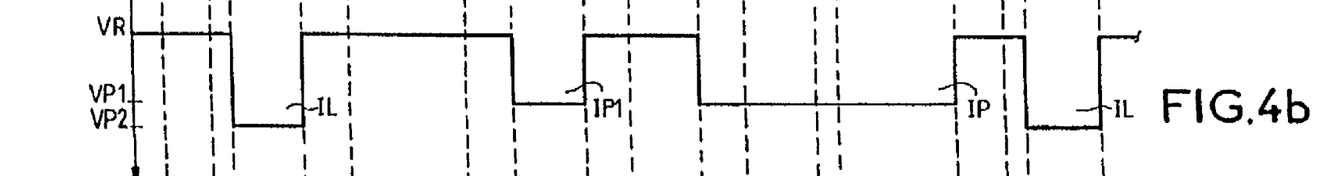
Figure 4C:
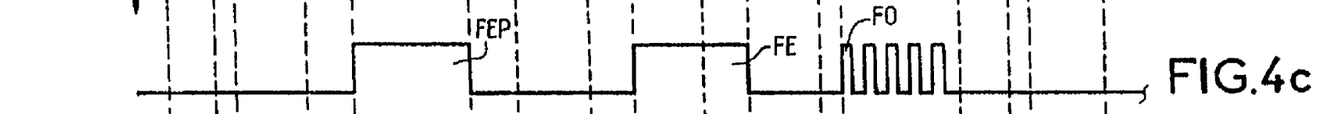
Figure 4D:
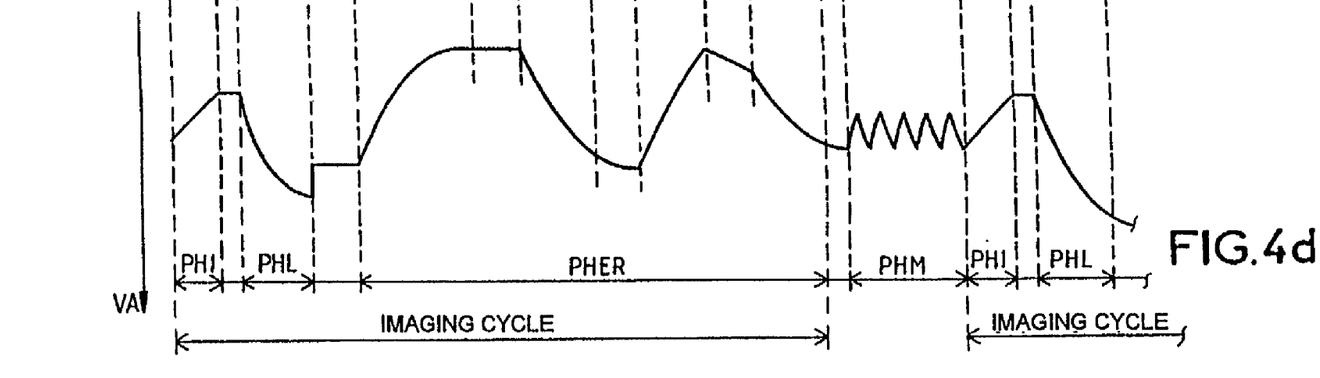

The development of the control process according to the invention, with two imaging cycles separated by a holding phase, will now be described, taking the photosensitive device of FIG. 2 as an example, each photosensitive point of which comprises a switching diode Dc to fulfil the switching function. FIG. 3 are time diagrams of the various events relating to the control process according to the invention. FIG. 3a illustrates the imaging phases PHI, FIG. 3b shows the signals applied to a row conductor, Y1 for example, especially for the purpose of reading, FIG. 3c the erasure signals of a photosensitive point P1 for example, FIG. 3d the variations in the voltage VA at the point "A" which is at the junction between the photodiode and the switching element of the point P1 and FIG. 3e makes it possible to locate the times during which the reset switches I1 to I3 go from the closed state (0) to the open state (1) so as to enable the charges read to be integrated in the open state by the amplifiers G1 to G3.

In the nonlimiting example described we start at time t0 by the start of a first imaging cycle firstly comprising an imaging phase PHI in which the photosensitive point P1 will be exposed to a signal to be picked up, this imaging phase PHI is followed by a read phase PHL. The two diodes Dp, Dc of the photosensitive point P1 in question are reverse biased, and in this state each one constitutes a capacitor. It should be noted that generally, the two diodes Dp, Dc are designed so that the capacitor presented by the photodiode Dp is the strongest (for example, by about 50 times). The illumination is between a maximum illumination and zero illumination to the extent that the photosensitive point may remain in darkness. This is what happens especially on taking the offset image.

The illumination creates a variation (in this case an increase) in the voltage VA at the point A, this variation is connected to the amount of charge accumulated at the point A under the effect of the illumination. The voltage VA goes from VA1 at time t0 to VA2 at time t1, which marks the end of the imaging phase PHI.

Time t2 marks the start of the read phase PHL. It makes it possible to read the amount of charge accumulated at the point A during the imaging phase PHI which has just taken place. The photosensitive points P1 to P9 are read row by row, simultaneously for all the photosensitive points P1 to P9 connected to the same row conductor Y1 to Y3. To this end, the row control circuit 3 applies a pulse IL called a "read pulse" with a given amplitude VP2 to each addressed row conductor Y1 to Y3; the row conductors which are not addressed are kept at a reference potential VR or rest potential, which is for example ground, and which may be the same potential as that which is applied to the column conductors X1 to X3. A voltage source 4, delivering the voltage VP2 to the row control circuit 3, serves to define the amplitude of the read pulses IL applied to the row conductors.

For the purpose of simplification, between time t1 and time t2, we have omitted showing the effect of the darkness currents which cause the voltage VA to increase slightly. The rising edge of the read pulse IL, which has a negative sign with respect to a reference voltage VR and the amplitude VP2, has the effect of causing the switching diode DC to conduct in the forward direction and the latter charges the capacitor which constitutes the photodiode Dp. The voltage VA decreases exponentially from the voltage VA2 to the voltage VA3 at time t3 when the read pulse IL ceases and when the voltage on the row conductor Y1 returns to the reference value VR.

The switching diode Dc is put into reverse bias and forms a capacitor. At time t3, the voltage VA increases from VA3 to VA4 by capacitive division.

All the row conductors Y1 to Y3 receive a read pulse IL one after the other during this read phase PHL which ceases at time t'1 but the time diagram of FIG. 3b shows only the read pulse applied to the row conductor Y1.

Next, the erasure and reinitialization phase PHER starts at time t4, which aims to erase the traces of taking the previous image and to prevent any correlation between taking the previous image and taking a future image.

This phase comprises an erasure which consists in saturating the existing traps in the semiconductor material of the photodiode Dp, followed by biasing which aims to put the photosensitive points P1 to P9 in a state such that they are receptive to taking a new image, that is to say so that they can produce and accumulate charge during the taking of the new image. The erasure is caused by exposing the photosensitive points to an optical flux FE of sufficient intensity and duration for the charges that it generates at the point "A" to cause the photodiode Dp to conduct in the forward direction.

From time t4, the voltage VA varies (by increasing) until it reaches a value VA5 before the end of the application of the erasure flux FE which corresponds to the break voltage of the photodiode Dp. The latter conducts in its forward conduction direction. The voltage VA keeps the value VA5 until time t6 which marks the start of the application, to the row conductors, of a biasing pulse IP having an amplitude VP1, which is negative with respect to the reference voltage VR, that is to say having the same direction as the read pulse IL. A voltage source 13, delivering the voltage VP1 to the row control circuit 3, serves to define the amplitude of the biasing pulses IP applied to the row conductors.

This biasing pulse IP reinitializes the photosensitive point, that is to say returns the photodiodes Dp to the reverse biased state so that they are receptive to taking a new image. They will again be able to produce and accumulate charge. Starting from time t6, the voltage VA decreases until taking the value VA1 equal to VP1 less the break voltage of the switching diode Dc at time t7. The photosensitive points P1 to P9 are then reinitialized and they have completely lost the memory of the image taken at the start of the imaging cycle at time t0. The erasure and reinitialization phase PHER is terminated together with the imaging cycle started at time t0. If a new imaging cycle does not start immediately after time t7 and if the photosensitive point P1 is no longer stimulated, the voltage VA will decrease until electrical equilibrium is reached, which may take several minutes or even a few hours, the future taking of an image will be dependent on the duration between time t7 and time t'0 marking start of a second imaging cycle. A phase seeking electrical equilibrium then starts between the reverse current of the photodiode Dp, a relaxation current of the traps and the forward current of the switching diode Dc. The situation is then the same as that described in FIG. 1a if the imaging cycles are not regular.

According to a characteristic of the process subject of the invention, a holding phase PHM starts from a time t8 which follows time t7. It finishes at a time t'0 which marks the start of a second imaging cycle. The duration of the holding phase is equal to a whole number of equal time intervals dt, of a duration as short as possible, each time interval dt starts by exposing the photosensitive points to an optical flash FO, for the rest of time interval dt, the photodiodes are reverse biased. In other words, the photosensitive points are exposed to a burst of periodic optical flashes FO with a period dt which is as short as possible.

Thus, during this holding phase PHM, the photosensitive points are kept in a substantially constant electrical state.

The effect of exposing a photosensitive point to an optical flash FO is to increase the voltage VA up to a value VA7 and to fill the traps. When it ceases and the photodiode is reverse biased, the traps empty and the voltage VA decreases down to a value VA8. It is arranged that the voltage VA keeps substantially the same value VA8 at the end of each time interval dt by adjusting the respective duration of the optical flashes FO and the time intervals dt. When a new optical flash is applied, the voltage VA increases again up to VA7 and so on. The voltage VA will continue to vary between the two limits VA7, VA8 while this holding phase PHM continues. In the example illustrated in FIGS. 3, the reverse bias of the photodiodes Dp is obtained by maintaining a biasing pulse IP for the whole duration of the holding phase PHM. More specifically, in order to simplify the controls, it is preferable that the biasing pulse IP of the erasure and reinitialization phase PHER is continued through the entire holding phase since, as will be explained subsequently, attempts are made to start the holding phase PHM as quickly as possible after the end of the erasure and reinitialization phase PHER.

The period dt of the optical flashes is chosen to be as short as possible, for example about 60 ms, in order to allow image requests which are as asynchronous as possible. This is because, when an operator requests an image at a time t9, for example, during a time interval dt of the holding phase PHM, the start of the second imaging cycle is delayed until time t'0 which corresponds to the end of the time interval dt during which the image request occurs. Time t'0 marks the end of the optical flashes and the end of the biasing pulse IP. In other words, the imaging cycles are synchronized to the end of a time interval dt.

In order to avoid disturbances connected with the electromagnetic field originating from the mains frequency, it is possible that the time intervals dt are made synchronous with the mains. Each time interval dt then has the value, for example, of 20 milliseconds if the mains frequency is 50 Hz or 16.66 milliseconds if it has the value of 60 Hz, as in the United States.

In order to further improve the efficiency of the erasure and reinitialization phase PHER with respect to the example described in FIGS. 3, if only very small remanence levels are tolerated, it is possible to provide, before exposure of the photosensitive points to the optical erasure flux FE, at least one exposure to an optical pre-erasure flux FEP without the photodiodes being bias controlled. The row conductors Y1 to Y3 are at the potential VR. The optical pre-erasure flux has an intensity and a duration such that the photodiode Dp passes into forward mode. At the end of the pre-erasure FEP, the photodiodes are put into reverse bias by applying a biasing pulse IP1 on the row conductors Y1 to Y3, this pulse IP1 ceasing before exposing the photosensitive points to a new illumination, that is to say either a new pre-illumination FEP or the illumination FE. The time diagrams of FIGS. 4a to 4d show this variant of the process according to the invention.

The imaging and read phases take place between t0 or t'0 and t3 and are similar to those of FIGS. 3 while the erasure and the reinitialization phase PHER has been extended. The holding phase PHM is also similar to that which was described previously.

In the example of FIGS. 4, the erasure and reinitialization phase PHER starts at time t4 with at least one exposure of the photosensitive points to an optical pre-erasure flux FEP and this until time t5. The photodiodes Dp switch to conduction in the forward direction and the voltage VA increases up to the moment where it reaches the break voltage of the photodiodes Dp and then remains substantially constant until t5 which marks the end of the exposure to the optical pre-erasure flux FEP. Time t6 marks the start of the application of a biasing pulse IP1 of amplitude VP1 that is intended to reset the photodiodes Dp into the reverse bias state so that the photosensitive points are in a state receptive to a subsequent image request. The voltage VA decreases to draw back, at time t7, which marks the end of the biasing pulse IP1, toward the voltage VP1 less the break voltage of the switching diode Dc. After time t7 the actual erasure can commence. This erasure starts at time t8 with exposure to an optical erasure flux FE. The development of the process then corresponds to that which was described in FIGS. 3 from time t4, except for the fact that the biasing pulse IP starts at time t9 when the erasure flux FE has not yet stopped. Between time t8 and time t9, the voltage VA increases until the photodiode Dp switches to conduct in the forward direction. Between time t9 and time t10 which marks the end of the exposure to the erasure flux FE, the voltage VA starts to decrease with a lower slope than if the biasing pulse IP was applied alone. The slope increases after time t10 since the erasure flux FE has stopped.

The voltage VA continues to decrease until reaching the voltage VP1 less the break voltage of the switching diode Dc, at time t11. From this time t11, which marks the end of the erasure and reinitialization phase PHER, the holding phase PHM is started as quickly as possible. This holding phase PHM starts at time t12. Between time t11 and time t12, the electrical state of the photodiodes varies and the voltage VA continues to decrease. The time interval between t11 and t12 is set to a maximum of, for example, 500 milliseconds, so that the voltage VA keeps a value close to that reached at the end of the erasure and reinitialization phase PHER. The value of 500 milliseconds is not limiting. The holding phase is identical to that which was described in FIG. 3 between times t8 and t'0.

The optical flux or the optical fluxes of the erasure and reinitialization phase are delivered by a source SL which is in itself conventional. It may be produced for example by a lumiplate, an array of light-emitting diodes or a photoluminescent film.

It may be placed against the substrate 7, away from the photosensitive points, if it is transparent to light. It may be made of glass or quartz for example. In FIG. 2, the source SL is represented by dotted lines, and supposing that the substrate 7 is in the plane of the figure, it would be located behind. It could of course be located at the side of the photosensitive points, insofar as it is not detrimental to the exposure of the points on imaging.

The source SL can be controlled conventionally from a signal delivered by an output SS1 of the row control circuit 3.

The source which makes it possible to supply the optical flashes FO may be of the same nature as that SL which delivers the optical erasure fluxes. The same source SL may deliver the optical flashes and the erasure flux as illustrated in FIG. 2, but this is not essential and distinct sources may be provided.

The biasing pulses IP have an amplitude VP1 which is less than that VP2 of the read pulses IL as explained in French Patent Application FR-A-2 760 585. They may be applied to all the row conductors Y1 to Y3 by the row control circuit 3, either simultaneously or row by row.

Figure 5:
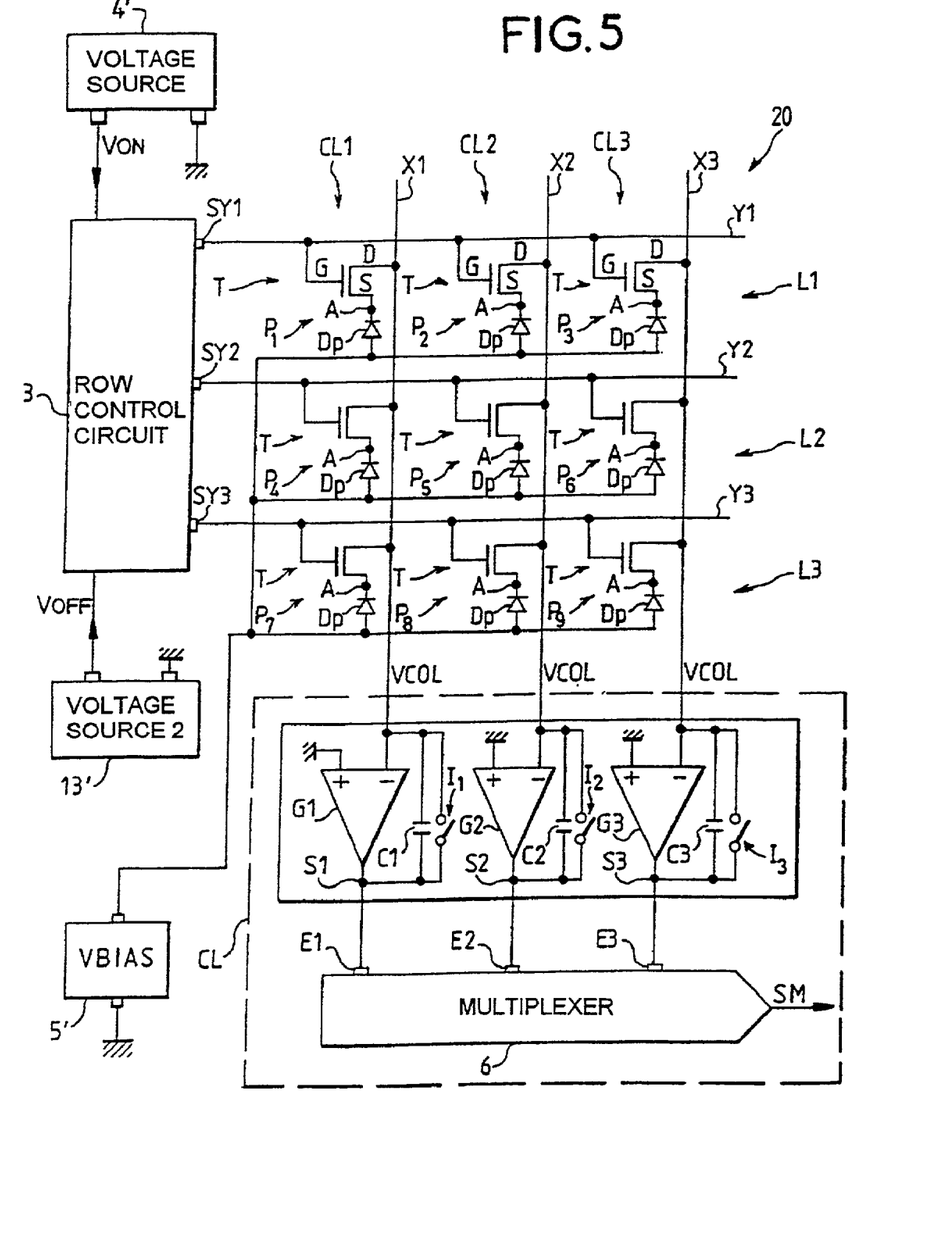
FIG. 5 shows a variant of a photosensitive device to which the process of the invention may be applied.

Instead of the switching element Dc of the photosensitive points P1 to P9 being a switching diode as illustrated in FIG. 2, it is possible, as illustrated in FIG. 5, to replace it with a transistor T also produced by thin film deposition techniques (TFT).

In the diagram of FIG. 5, each transistor T is connected by its source S to the cathode of the photodiode Dp, that is to say to the point A, its gate G is connected to the row conductor Y1 to Y3 to which the photosensitive point belongs and its drain D is connected to the column conductor X1 to X3 to which the photosensitive point belongs. The anodes of all the photodiodes Dp are joined and connected to a specific supply 5' which delivers a negative biasing voltage VBIAS of about −5 volts to −10 volts and which serves to constitute the reverse bias of the photodiodes Dp.

The row control circuit 3 delivers, via its outputs SY1 to SY3, voltage signals or pulses which, on going from VOFF to VON cause all the transistors T of a same row to pass simultaneously from the "off" state to the "on" state, respectively. The row control circuit 3 receives the voltage VON from a voltage source 4' and the voltage VOFF from a voltage source 13'. The voltage VOFF is about −10 volts while the voltage VON is about +15 volts.

Setting a transistor T to the "on" state causes the voltage VCOL, present on the column to which the drain D of the transistor T is connected, to be applied to the cathode of the photodiode Dp to which the transistor is connected. This voltage VCOL is generally about 0 volts.

The operation of the photosensitive point in question is similar to that which has just been described with the diodes.

Figure 6A:
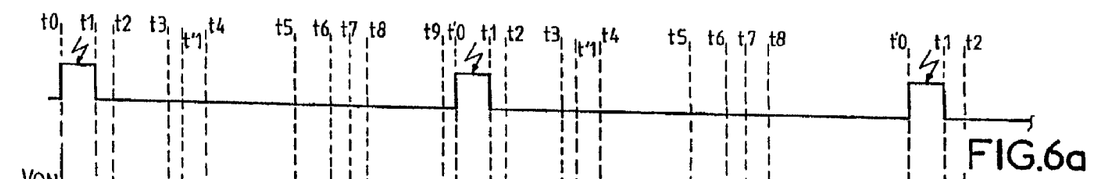
FIGS. 6a to 6d show timing diagrams illustrating the operation of the photosensitive device of FIG. 5 under the control of the process of the invention.

However, the voltage VA at the junction between the photodiode Dp and the transistor T varies inversely to that of a photosensitive point with two diodes. The time diagram of FIG. 6d is shown as a mirror image of FIG. 3d. With regard to the FIGS. 6a and 6c, they are similar to those of FIGS. 3a and 3c.

Figure 6B:
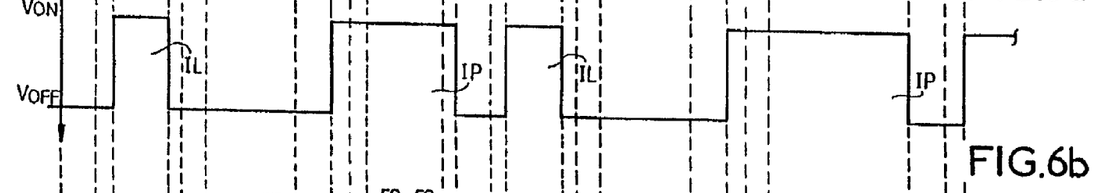
Figures 6C, 6D:
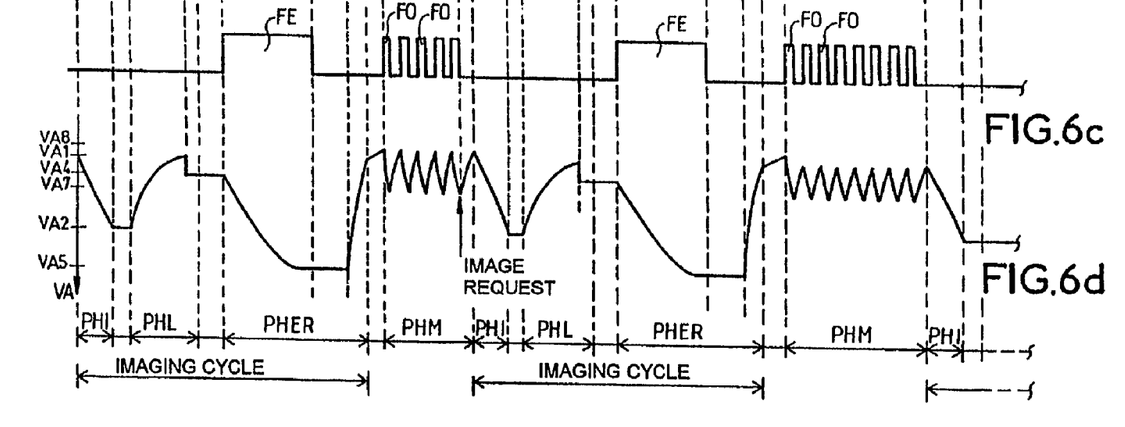

As for FIG. 6b, which shows the signal applied to the row conductor of the photosensitive point in question, only the amplitude and the sign of the pulses applied vary compared with those of FIG. 3b. When it is not addressed, the row conductor in question is held at the potential VOFF and when it is addressed in read, it is brought by means of a read pulse IL to the amplitude VON.

Another difference to be stressed with respect to the example of FIGS. 3 is that the biasing pulse IP preferably has the same amplitude as the read pulse IL; it is not useful to use drive charges as disclosed in Patent Application FR-A-2 760 585 since the electrical quality of a transistor with the switching function is better than that of a diode.

The process of the invention is applicable to the control of photosensitive devices used in detecting radiological images. These devices therefore comprise a scintillator in order to convert incident radiation, generally X-ray radiation, into light radiation in the band of wavelengths to which the photodiodes Dp are sensitive. On the device shown in FIG. 2, a scintillator 9 is symbolized by a square in dotted lines. It may be made from cesium iodide which is known for its low remanence. This scintillator 9 is deposited on the matrix 2 so as to be inserted between the latter and the incident X-ray radiation.

What is claimed is:

1. A process for controlling a photosensitive device including at least one photosensitive point with a photodiode connected to a switching element, comprising:
   submitting the photosensitive point to successive imaging cycles; and
   producing between a first imaging cycle and a second imaging cycle, a holding phase terminating at a start of the second imaging cycle,
   wherein, during the holding phase, whose duration is equal to several equal time intervals, the photosensitive point is exposed to an optical flash at a start of each time interval and between successive optical flashes, the photodiode is reverse biased, the junction region between the photodiode and the switching element having substantially a same potential at an end of each time interval.

2. The control process as claimed in claim 1, wherein an imaging cycle comprises an imaging phase followed by a read phase of reading an amount of charge accumulated in the junction region during the imaging phase, the read phase being followed by an erasure and reinitialization phase, during which the photosensitive point is exposed to an optical erasure flux causing the photodiode to conduct in a forward direction, and the photodiode is reverse biased at an end of the erasure and reinitialization phase.

3. The control process as claimed in claim 2, wherein the imaging cycles are requested by an operator, and the control process further comprises synchronizing the start of an imaging cycle with an end of the time interval during which the operator's request occurs.

4. The control process as claimed in claim 1, wherein the frequency of the optical flashes is synchronized with a mains frequency.

5. The control process as claimed in claim 1, further comprising applying a biasing pulse to the photosensitive point for an entire duration of the holding phase.

6. The control process as claimed in claim 2, further comprising, during the erasure and reinitialization phase, applying to the photosensitive point a biasing pulse starting before the end of the exposure to the optical erasure flux and continuing thereafter.

7. The control process as claimed in claim 6, wherein the biasing pulse of the erasure and reinitialization phase is continued during the holding phase.

8. The control process as claimed in claim 2, further comprising, during the erasure and reinitialization phase, before the exposure of the photosensitive point to the optical erasure flux, exposing the photosensitive point at least once to an optical pre-erasure flux causing the photodiode to conduct in the forward direction.

9. The control process as claimed in claim 8, wherein the exposure of the photosensitive point to the optical pre-erasure flux is followed by the reverse biasing of the photodiode, the reverse biasing of the photodiode occurring before exposure to the optical erasure flux.

10. The control process as claimed in claim 9, further comprising applying to the photosensitive point a biasing pulse starting after the end of the exposure to the optical pre-erasure flux and terminating before the start of the exposure to the optical erasure flux.

11. The control process as claimed in claim 1, further comprising starting the holding phase as quickly as possible after the end of the first imaging cycle.

12. The control process as claimed in claim 2, further comprising, during the read phase, applying to the photosensitive point a read pulse having a same sign as and an amplitude greater than or equal to the biasing pulse.

13. The control process as claimed in claim 1, wherein the switching element is a diode.

14. The control process as claimed in claim 1, wherein the switching element is a transistor.

15. The control process as claimed in claim 1, wherein the photosensitive point is produced on a first face of a substrate transparent to light, and the control process further comprises applying the optical flashes to the photosensitive point through the transparent substrate.

16. The control process as claimed in claim 2, further comprising using a same source to deliver the optical flashes and the optical erasure flux.

17. A photosensitive device implementing the control process as claimed in claim 4, comprising:
at least one photosensitive point with a photodiode connected to a switching element;
means for exposing the photosensitive point to a series of periodic optical flashes; and
means for reverse biasing of the photodiode at an end of an optical flash so that the photodiode in a receptive state from a start of a second imaging cycle.

18. The device as claimed in claim 17, wherein the means for reverse biasing of the photodiode is configured to apply to the photosensitive point a biasing pulse during the exposure to the series of optical flashes.

19. The device as claimed in claim 17, wherein the switching element is a diode.

20. The device as claimed in claim 17, wherein the switching element is a transistor.

21. The device as claimed in claim 17, wherein the photosensitive point is produced on a first face of a substrate transparent to light and the device further comprises a source configured to deliver the optical flashes, placed on the second face of the substrate.

22. The photosensitive device as claimed in claim 17, further comprising a scintillator configured to convert X-ray radiation incident on taking the image into optical radiation, the photodiode being sensitive to the optical radiation.

* * * * *